US 7,847,625 B2

(12) United States Patent
Roh et al.

(10) Patent No.: US 7,847,625 B2
(45) Date of Patent: Dec. 7, 2010

(54) SWITCHED CAPACITOR CIRCUIT WITH REDUCED LEAKAGE CURRENT

(75) Inventors: Hyung Dong Roh, Seoul (KR); Hyoung Joong Kim, Seoul (KR); Jeong Jin Roh, Yongin-si (KR); Yi Gyeong Kim, Daejeon (KR); Jong Kee Kwon, Daejeon (KR)

(73) Assignees: Electronics and Telecommunications Research Institute, Daejeon (KR); Industry-University Cooperation Foundation Hanyang University, Ansan (KR)

( * ) Notice: Subject to any disclaimer, the term of this patent is extended or adjusted under 35 U.S.C. 154(b) by 0 days.

(21) Appl. No.: 12/469,632

(22) Filed: May 20, 2009

(65) Prior Publication Data
US 2010/0090756 A1 Apr. 15, 2010

(30) Foreign Application Priority Data
Oct. 10, 2008 (KR) ...................... 10-2008-0099779

(51) Int. Cl.
H03K 5/00 (2006.01)
(52) U.S. Cl. .................. 327/554; 327/94; 327/337; 330/9
(58) Field of Classification Search ......... 327/551–559, 327/94, 337, 362; 330/9
See application file for complete search history.

(56) References Cited

U.S. PATENT DOCUMENTS

| 6,636,083 | B1 * | 10/2003 | Wong et al. ............... 327/94 |
| 7,564,273 | B2 | 7/2009 | Guyton et al. |
| 2002/0175738 | A1 * | 11/2002 | Cyrusian ................. 327/337 |

FOREIGN PATENT DOCUMENTS

| JP | 11-163647 A | 6/1999 |
| JP | 11-234088 A | 8/1999 |
| JP | 2005-5620 A | 1/2005 |

OTHER PUBLICATIONS

Behzad Razavi, "Design of Analog CMOS Integrated Circuits," McGraw-Hill, 2000, pp. 439-442.
Hiroshi Kawaguchi et al., "A Super Cut-Off CMOS (SCCMOS) Scheme for 0.5-V Supply Voltage with Picoampere Stand-By Current," IEEE Journal of Solid-State Circuits, Oct. 2000, pp. 1498-1501, vol. 35, No. 10.
Koichi Ishida et al., "Managing Subthreshold Leakage in Charge-Based Analog Circuits With Low-$V_{TH}$ Transistors by Analog T-Switch (AT-Switch) and Super Cut-off CMOS (SCCMOS)," IEEE Journal of Solid-State Circuits, Apr. 2006, pp. 859-867, vol. 41, No. 4, Apr. 2006.

* cited by examiner

Primary Examiner—Dinh T. Le

(57) ABSTRACT

Provided is a switched capacitor circuit which prevents leakage current by equalizing voltages at nodes where leakage current tends to flow in a sampling mode, and prevents errors in an output signal by minimizing voltage drop caused by leakage current in an integrating mode.

10 Claims, 7 Drawing Sheets

SWITCHED CAPACITOR CIRCUIT WITH REDUCED LEAKAGE CURRENT

CROSS-REFERENCE TO RELATED APPLICATION

This application claims priority to and the benefit of Korean Patent Application No. 10-2008-0099779, filed Oct. 10, 2008, the disclosure of which is incorporated herein by reference in its entirety.

BACKGROUND

1. Field of the Invention

The present invention relates to a switched capacitor circuit with reduced leakage current, and more particularly, to a switched capacitor circuit in which leakage current is prevented by equalizing voltages at nodes where leakage current tends to flow in a sampling mode, and voltage drop caused by leakage current is minimized in an integrating mode, thereby preventing errors in an output signal.

2. Discussion of Related Art

Generally, a switched capacitor circuit is composed of only a capacitor and a switch, without inductance or resistance. It is widely used in various devices such as an integrator, an analog filter, an analog-digital convertor (ADC) and a digital-analog convertor (DAC) because it can be easily integrated into a single chip in a CMOS process and can reduce power consumption.

FIG. 1A illustrates a conventional switched capacitor circuit 100a using switching devices.

Referring to FIG. 1A, the conventional switched capacitor circuit 100a includes an operational amplifier OP, first to fourth switches S1 to S4, a sampling capacitor $C_S$, and a feedback capacitor $C_F$.

Such a switched capacitor circuit 100a is operated as an integrator, which will be simply described below.

If T is a half of a sampling cycle, when t=(k−1)T, the first and third switches S1 and S3 are on, and thus an input voltage $V_{in}$ is applied across the sampling capacitor $C_S$. Here, a quantity of electrical charge $Q_{C_S}$ charged in the sampling capacitor $C_S$ is given by Formula 1:

$$Q_{C_S} = V_{in}[(k-1)T] \cdot C_S \qquad \text{[Formula 1]}$$

Then, when t=kT, the second and fourth switches S2 and S4 are on, and thus the electrical charge charged in the sampling capacitor $C_S$ is transferred to the feedback capacitor $C_F$. The transferred electrical charge is added to an output voltage at a time (k−1)T, thereby integrating the output voltage.

That is, when t=kT, a final output voltage $V_{out}$ is given by Formula 2:

$$V_{out}(k \cdot T) = V_{out}[(k-1) \cdot T] - V_{in}[(k-1) \cdot T] \cdot \frac{C_S}{C_F} \qquad \text{[Formula 2]}$$

However, the switched capacitor circuit 100a becomes difficult to switch due to high threshold voltages of the first to fourth switches S1 to S4 as a supplied voltage is gradually decreased.

To solve this problem, as illustrated in FIG. 1B, a switched capacitor circuit 100b in which the first to fourth switches S1 to S4 are substituted with MOS transistors M1 to M5 having low threshold voltages is disclosed.

FIG. 1B illustrates a conventional switched capacitor circuit 100b using MOS transistors.

Referring to FIG. 1B, the conventional switched capacitor circuit 100b includes first to fifth MOS transistors M1 to M5, an operational amplifier OP, a sampling capacitor $C_S$ and a feedback capacitor $C_F$.

The first to third MOS transistors M1 to M3 apply an input voltage $V_{in}$ across the sampling capacitor $C_S$ in response to a first signal ϕ1, and the fourth and fifth transistors M4 and M5 transfer electrical charge charged in the sampling capacitor $C_S$ to the feedback capacitor $C_F$ in response to a second signal ϕ2.

Here, the first and second MOS transistors M1 and M2 are complementarily connected to constitute a CMOS transistor in order to widen an input voltage range, and the third to fifth MOS transistors M3 to M5 are NMOS or PMOS transistors.

In the switched capacitor circuit 100b, if the first signal ϕ1 is 1, the first to third MOS transistors M1 to M3 are on, and the fourth and fifth MOS transistors M4 and M5 are off, and thus an input voltage $V_{in}$ is charged in the sampling capacitor $C_S$.

However, although the fourth MOS transistor M4 is off, some quantity of leakage current $I_{ds\_M4}$ given by Formula 3 flows in the fourth MOS transistor M4:

$$I_{ds\_M4} = \mu_0 C_{OX} \frac{W}{L}(m-1)(v_T)^2 \times e^{\left(\frac{V_{g\_M4} - V_{TH\_M4}}{mv_T}\right)} \times (1 - e^{-V_m/v_T}) \qquad \text{[Formula 3]}$$

Here, $v_T$ is a thermal voltage, m is a body effect coefficient, $\mu_0$ is zero bias mobility, and $C_{ox}$ is a gate oxide capacitance.

In Formula 3, provided that a gate voltage of the fourth MOS transistor M4 is fixed to 0, the leakage current $I_{ds\_M4}$ flowing in the fourth MOS transistor M4 is dependant on the input voltage $V_{in}$, and thus leakage current also flows in the first and second MOS transistors M1 and M2, which are in on state.

Here, since the first and second MOS transistors M1 and M2 have non-zero resistances because of their own characteristics, errors in an output signal can result from voltage drop caused by leakage current flowing in the first and second MOS transistors M1 and M2.

Further, if the second signal ϕ2 is 1, the first to third MOS transistors M1 to M3 are off and the fourth and fifth MOS transistors M4 and M5 are on. In this case, errors in an output signal can also result from voltage drop caused by leakage current in the first to third MOS transistors M1 to M3 and an on-resistance of the fourth and fifth transistors M4 and M5.

Errors in the output signal caused by the leakage current greatly affect the performance of ADCs, DACs and filters, which require low voltage and high precision. Thus, there is need of a means for reducing leakage current in a switched capacitor circuit.

SUMMARY OF THE INVENTION

The present invention is directed to a switched capacitor circuit with reduced leakage current.

One aspect of the present invention provides a switched capacitor circuit with reduced leakage current, which includes: first and second MOS transistors complementarily connected and configured to output an input voltage received from a first node to a second node in response to a first signal; a sampling capacitor whose end is connected to the second node; a third MOS transistor configured to connect the other end of the sampling capacitor to a ground terminal in response to the first signal; a fourth MOS transistor connected between the second node and a third node and configured to connect an end of the sampling capacitor to a ground terminal in response to a second signal; an operational amplifier having a feedback capacitor connected between a negative input end and an output end; a fifth MOS transistor configured to connect the other end of the sampling capacitor to the negative input end of the operational amplifier in response to the second signal; and a leakage current reduction circuit connected between an input end and each of the first and third nodes, wherein the leakage current reduction circuit prevents leakage current by equalizing voltages at the first and second nodes where leakage current tends to flow and a voltage at the third node in response to the first signal, and reduces voltage drop caused by leakage current flowing at the first node in response to the second signal.

Here, the leakage current reduction circuit may include sixth and seventh MOS transistors complementarily connected between the input end and the first node; eighth and ninth MOS transistors complementarily connected between the input end and the third node; a tenth MOS transistor connected between the first and third nodes and turned on in response to the second signal; and an eleventh MOS transistor connected between the third node and the ground terminal and turned on in response to the second signal.

In a sampling mode when the first signal is 1, the sixth and seventh MOS transistors and the eighth and ninth MOS transistors may have the same voltages at the first and third nodes, thereby preventing leakage of current from the tenth MOS transistor. As the voltage at the first node is equal to the voltage at the third node, a voltage at the second node may also be equal to the voltage at the third node, thereby preventing leakage of current from the fourth MOS transistor.

Meanwhile, the eleventh MOS transistor may have a lower on-resistance than the sixth to tenth MOS transistors, according to which the eleventh MOS transistor may reduce voltage drop caused by leakage current flowing in the sixth and seventh MOS transistors and the eighth and ninth MOS transistors in the integrating mode when the second signal is 1.

BRIEF DESCRIPTION OF THE DRAWINGS

The above and other objects, features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, a switched capacitor circuit with reduced leakage current according to an exemplary embodiment of the present invention will be described in detail with reference to the accompanying drawings.

Figure 1A:
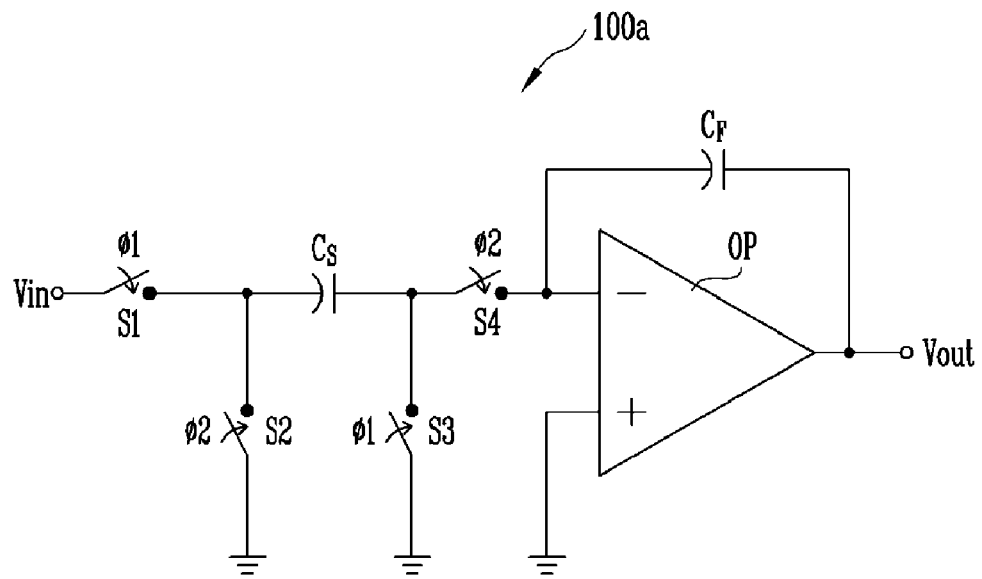
FIG. 1A illustrates a conventional switched capacitor circuit using switching devices.
Figure 1B:
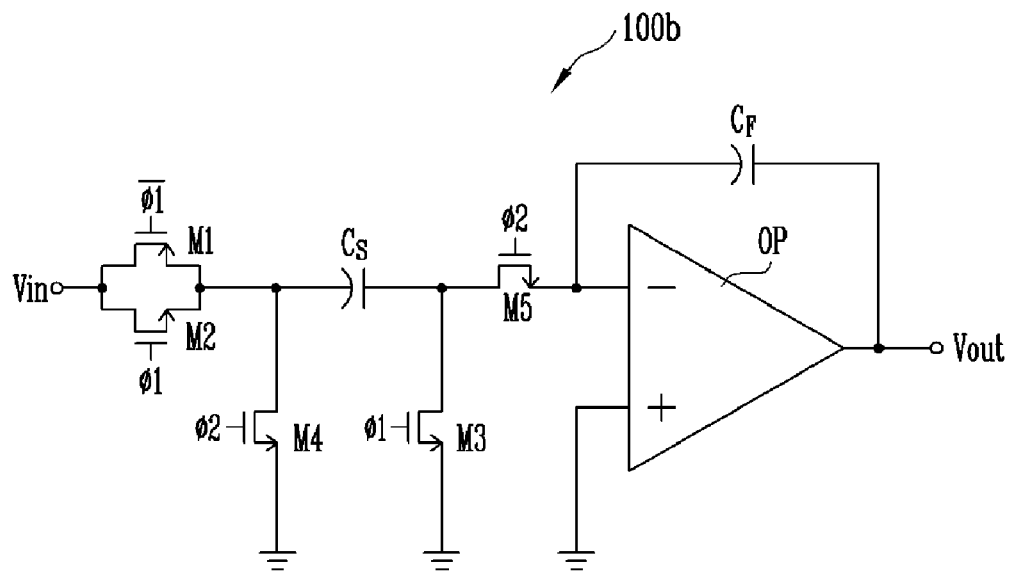
FIG. 1B illustrates a conventional switched capacitor circuit using MOS transistors.
Figure 2:
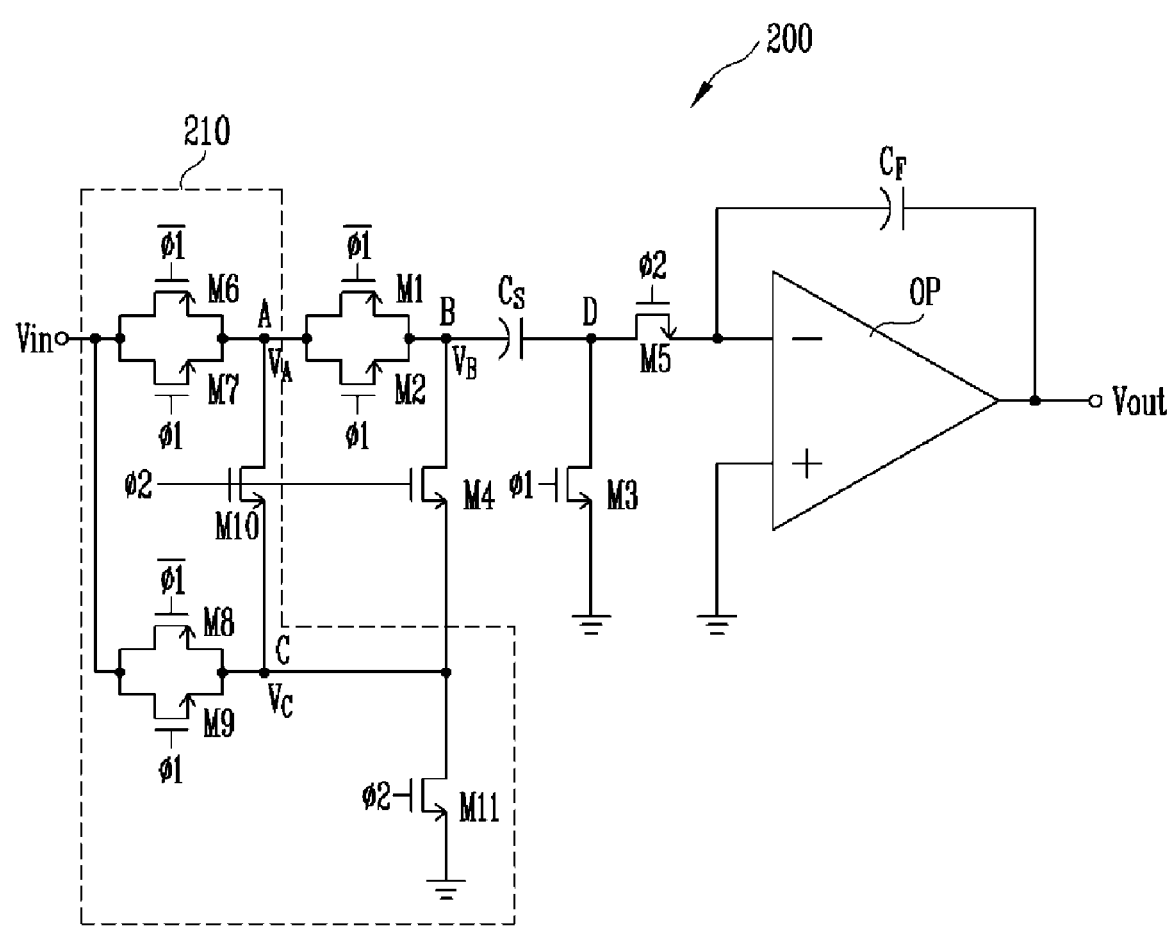
FIG. 2 illustrates a switched capacitor circuit with reduced leakage current according to an exemplary embodiment of the present invention.

FIG. 2 illustrates a switched capacitor circuit 200 according to an exemplary embodiment of the present invention.

Referring to FIG. 2, the switched capacitor circuit 200 according to an exemplary embodiment of the present invention includes a leakage current reduction circuit 210, first to fifth MOS transistors M1 to M5, a sampling capacitor $C_S$, a feedback capacitor $C_F$ and an operational amplifier OP.

The first to third MOS transistors M1 to M3 charge an electrical charge corresponding to an input voltage $V_{in}$ in the sampling capacitor $C_S$ in response to a first signal $\phi 1$, and the fourth and fifth MOS transistors M4 and M5 transfer the electrical charge charged in the sampling capacitor $C_S$ to the feedback capacitor $C_F$ in response to a second signal $\phi 2$.

The operational amplifier OP outputs the input voltage $V_{in}$ amplified by a ratio of the sampling capacitor $C_S$ to the feedback capacitor $C_F$ ($C_S/C_F$).

The leakage current reduction circuit 210 includes sixth and seventh MOS transistors M6 and M7 and eighth and ninth MOS transistors M8 and M9, each pair of which are complementarily connected to each other, a tenth MOS transistor M10 connected between an output end of the sixth and seventh MOS transistors M6 and M7 and an output end of the eighth and ninth MOS transistors M8 and M9, and an eleventh MOS transistor M11 connected to the tenth MOS transistor M10.

Here, each pair of the first and second MOS transistors M1 and M2, the sixth and seventh MOS transistors M6 and M7 and the eighth and ninth MOS transistors M8 and M9 may be complementarily connected to each other, thereby constituting a CMOS transistor.

The connections between the components will be simply described below.

The sixth and seventh MOS transistors M6 and M7 are complementarily connected between the input end and a first node A, and the eighth and ninth MOS transistors M8 and M9 are complementarily connected between the input end and a third node C.

A first signal $\overline{\phi 1}$ having an out-of-phase component and a first signal $\phi 1$ having an in-phase component are respectively input to gates of the sixth and seventh MOS transistors M6 and M7, and drains and sources of the sixth and seventh MOS transistors M6 and M7 are connected in common to the input end and the first node A.

The first signal $\overline{\phi 1}$ having an out-of-phase component and the first signal $\phi 1$ having an in-phase component are respectively input to gates of the eighth and ninth MOS transistors M8 and M9, and drains and sources of the eighth and ninth MOS transistors M8 and M9 are connected in common to the input end and the third node C.

The tenth MOS transistor M10 turned on in response to a second signal $\phi 2$ is connected between the first node A and the third node C, and then eleventh MOS transistor M11 turned on in response to the second signal $\phi 2$ is connected between the third node C and a ground terminal.

The first and second MOS transistors M1 and M2 are complementarily connected between the first node A and a second node B, and they output an input voltage received from the first node A to the second node B in response to the first signal $\phi 1$. Here, the first signal $\overline{\phi 1}$ having an out-of-phase component and the first signal $\phi 1$ having an in-phase component are respectively input to gates of the first and second MOS transistors M1 and M2.

One end of the sampling capacitor $C_S$ is connected to the second node B, and the other end of the sampling capacitor $C_S$ is connected to a ground terminal via the third MOS transistor M3 in response to the first signal $\phi 1$.

The fourth MOS transistor M4 is connected between the second node B and the third node C, and connects one end of the sampling capacitor $C_S$ to a ground terminal in response to the second signal $\phi 2$.

A feedback capacitor $C_F$ is connected between a negative input end and an output end of the operational amplifier OP, and the fifth MOS transistor M5 connects the other end of the sampling capacitor $C_S$ to the negative input end of the operational amplifier OP in response to the second signal φ2.

That is, the switched capacitor circuit 200 according to an exemplary embodiment of the present invention is characterized by including a leakage current reduction circuit 210 additionally connected to prevent leakage of current at an input end, unlike the conventional switched capacitor circuit 100b. Operation of the leakage current reduction circuit 210 will be described in detail.

First, when a transistor is off, a leakage current $I_{ds}$ flowing at both ends of the transistor may be given by Formula 4:

$$I_{ds} = \mu_0 C_{OX} \frac{W}{L}(m-1)(v_T)^2 \times e^{\frac{(V_{gs}-V_{TH})}{mv_T}} \times (1-e^{-V_{ds}/v_T}) \quad [\text{Formula 4}]$$

In the final term $1-e^{-V_{ds}/v_T}$ of Formula 4, if a voltage $V_{ds}$ between the drain and the source of the transistor is less than a thermal voltage $v_T$, $e^{-V_{ds}/v_T}$ becomes abruptly close to 1, and thus the final term $1-e^{-V_{ds}/v_T}$ goes to 0.

Thus, when the voltage $V_{ds}$ between the drain and source of the transistor is reduced, the leakage current flowing at both ends of the transistor in an off state can be reduced.

Using such a principle, the leakage current reduction circuit 210 according to an exemplary embodiment of the present invention prevents leakage current by equalizing voltages at nodes where leakage current tends to flow in a sampling mode when the first signal φ1 is 1, and minimizes voltage drop caused by leakage current in an integrating mode when the second signal φ2 is 1, thereby preventing errors in an output signal. This procedure will be described in more detail below.

Figure 3A:
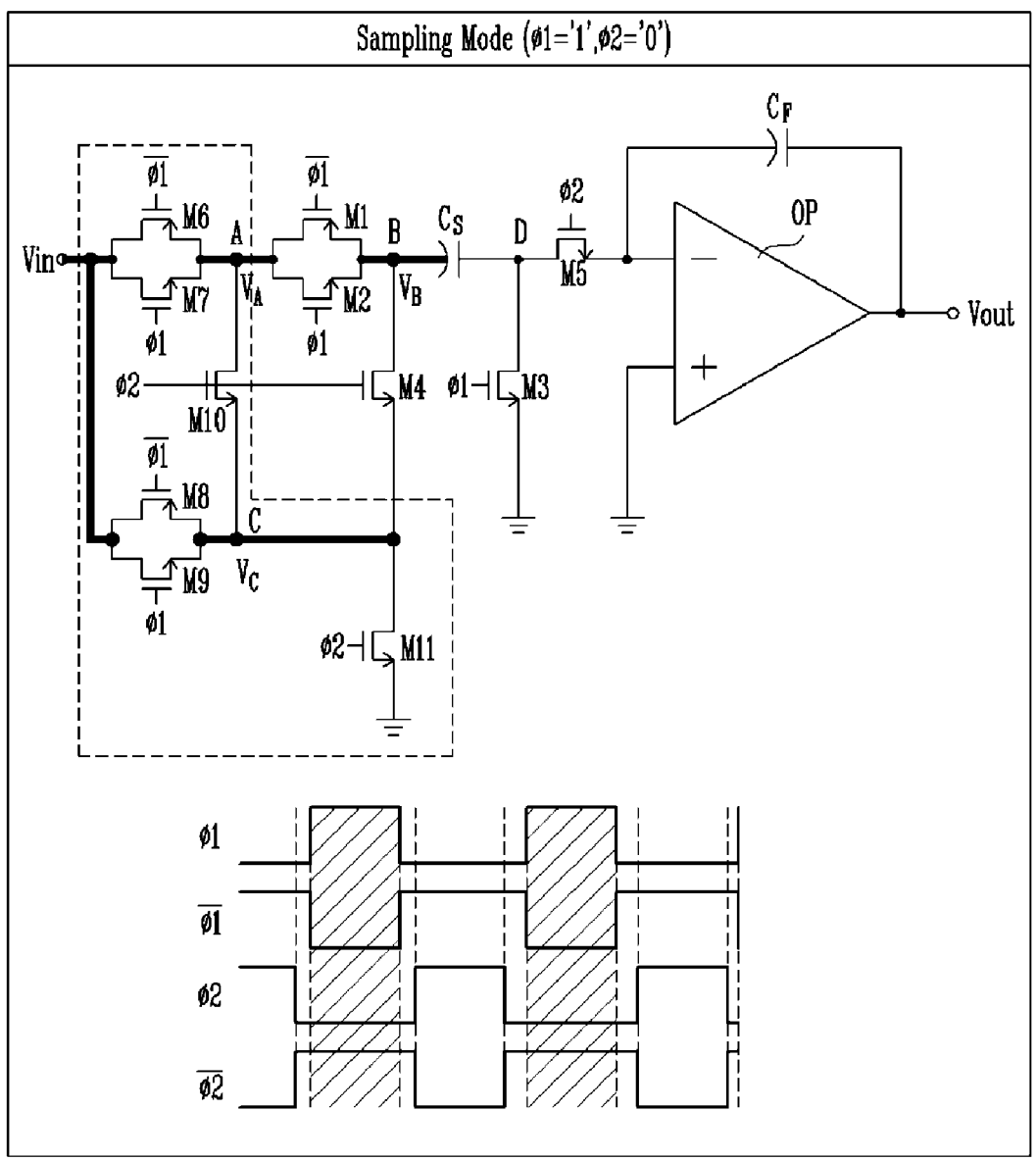
FIGS. 3A and 3B are timing diagrams illustrating operation of a leakage current reduction circuit according to an exemplary embodiment of the present invention.
Figure 3B:
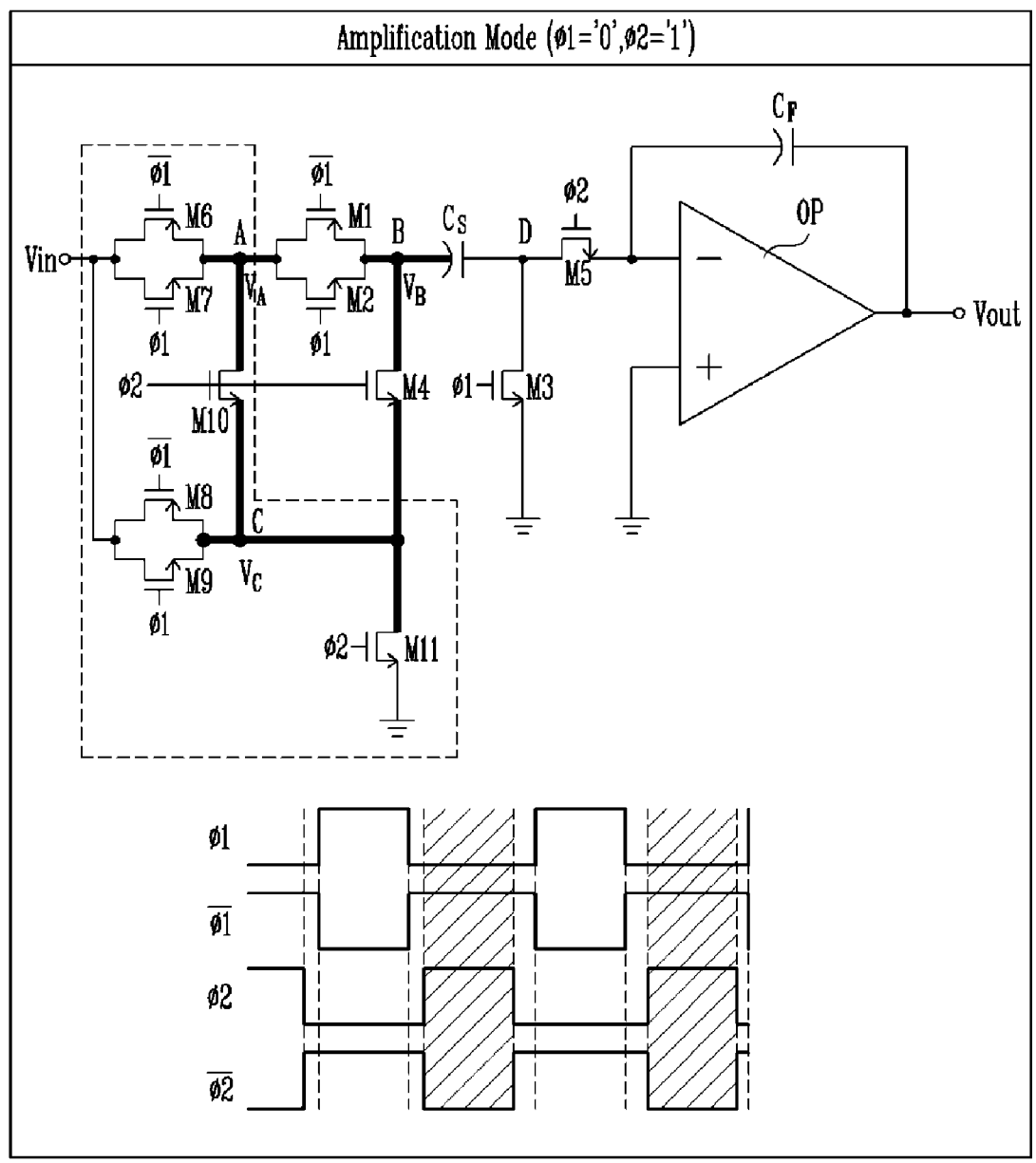

FIGS. 3A and 3B are timing diagrams illustrating operation of the leakage current reduction circuit 210 according to an exemplary embodiment of the present invention.

Referring to FIG. 3A, in the sampling mode when the first signal φ1 is 1, the first to third MOS transistors M1 to M3 and the sixth to ninth MOS transistors M6 to M9 are on, but the fourth and fifth MOS transistors M4 and M5 and the tenth and eleventh MOS transistors M10 and M11 are off.

Here, a leakage current $I_{ds\_M10}$ flowing in the tenth MOS transistor M10 and a leakage current $I_{ds\_M4}$ flowing in the fourth MOS transistor M4 can be given by Formula 5 below:

$$I_{ds\_M10} = \mu_0 C_{OX} \frac{W}{L}(m-1)(v_T)^2 \times \quad [\text{Formula 5}]$$
$$e^{\frac{(V_{g\_M10}-V_{TH\_M10})}{mv_T}} \times (1-e^{-(V_A-V_C)/v_T})$$
$$I_{ds\_M4} = \mu_0 C_{OX} \frac{W}{L}(m-1)(v_T)^2 \times$$
$$e^{\frac{(V_{g\_M4}-V_{TH\_M4})}{mv_T}} \times (1-e^{-(V_B-V_C)/v_T})$$

In Formula 5, when voltages $V_A$ and $V_B$ at the first and second nodes A and B become equal to a voltage $V_C$ at the third node C, the final terms $(1-e^{-(V_A-V_C)/v_T})$ and $(1-e^{-(V_B-V_C)/v_T})$ become 0.

Thus, when the voltages $V_A$ and $V_B$ at the first and second nodes A and B become equal to the voltage $V_C$ at the third node C in the sampling mode when the first signal φ1 is 1, voltages between drains and sources of the tenth MOS transistor M10 and the fourth MOS transistor M4 become 0, and thereby leakage current in the tenth and fourth MOS transistors M10 and M4 may be prevented.

That is, the leakage current reduction circuit 210 prevents leakage current by equalizing the voltages $V_A$ and $V_B$ at the first and second nodes A and B where leakage current tends to flow to the voltage $V_C$ at the third node C through the sixth to tenth MOS transistors M6 to M10 in the sampling mode when the first signal φ1 is 1.

Next, referring to FIG. 3B, in the integrating mode when the second signal φ2 is 1, the fourth and fifth MOS transistors M4 and M5 and the tenth and eleventh MOS transistors M10 and M11 are on, but the other transistors are off.

Here, a leakage current $I_{ds\_M1}$ flowing in the first MOS transistor M1 and a leakage current $I_{ds\_M2}$ flowing in the second MOS transistor can be given by Formula 6:

$$I_{ds\_M1} = \mu_0 C_{OX} \frac{W}{L}(m-1)(v_T)^2 \times \quad [\text{Formula 6}]$$
$$e^{\frac{(V_{g\_M1}-V_{TH\_M1})}{mv_T}} \times (1-e^{-(V_A-V_B)/v_T})$$
$$I_{ds\_M2} = \mu_0 C_{OX} \frac{W}{L}(m-1)(v_T)^2 \times$$
$$e^{\frac{(V_{g\_M2}-V_{TH\_M2})}{mv_T}} \times (1-e^{-(V_A-V_B)/v_T})$$

In Formula 6, since a voltage $V_A$ at the first node A and a voltage $V_B$ at the second node B are equal, the final term $(1-e^{-(V_A-V_B)/v_T})$ becomes 0.

Thus, leakage current in the first and second MOS transistors M1 and M2 is prevented in the integrating mode when the second signal φ2 is 1.

While leakage current flows in the sixth and seventh MOS transistors M6 and M7 and the eighth and ninth MOS transistors M8 and M9, which are off, it is input to the eleventh MOS transistor M11.

Since a source is connected to a ground terminal in the eleventh MOS transistor M11, even if it does not have a larger width W, it has a 4- to 5-times lower on-resistance than the sixth to tenth MOS transistors M6 to M10. Thus, the eleventh MOS transistor M11 may minimize voltage drop caused by leakage current due to the lower on-resistance.

That is, the leakage current reduction circuit 210 minimizes the voltage drop caused by leakage current flowing in the sixth and seventh MOS transistors M6 and M7 and the eighth and ninth MOS transistors M8 and M9 through the eleventh MOS transistor M11 having a low on-resistance in the integrating mode when the second signal φ2 is 1, so that almost no errors are made in an output signal.

Figure 4A:
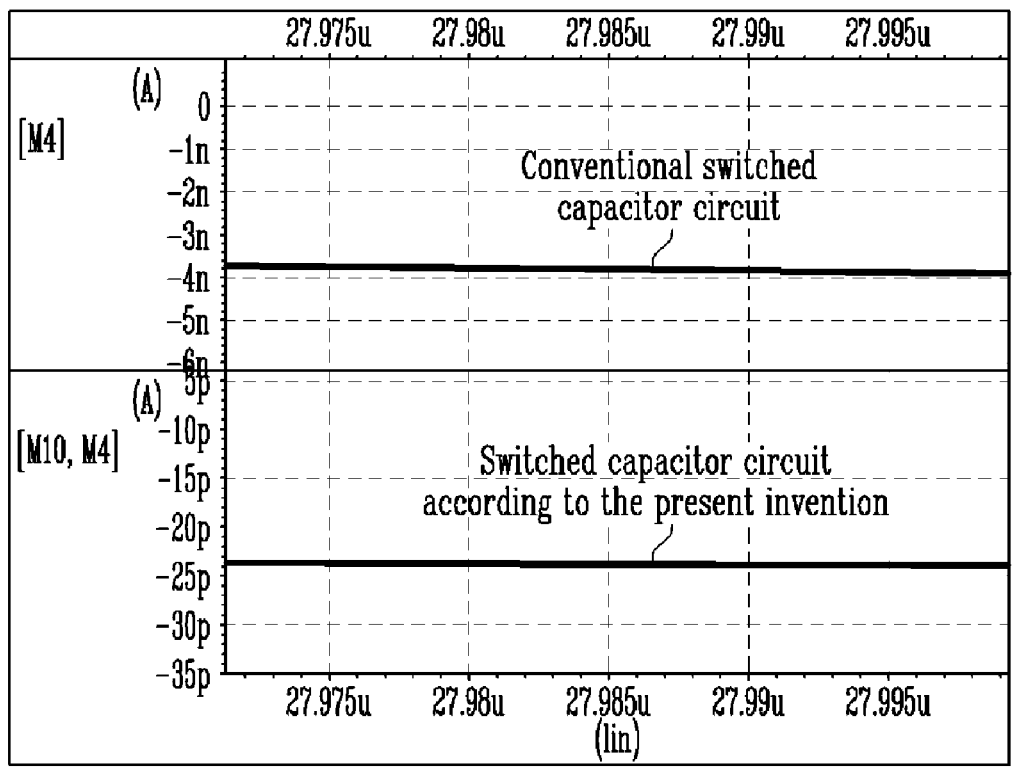
FIGS. 4A and 4B are graphs plotted by computer simulation for comparison of leakage current in the switched capacitor circuit according to an exemplary embodiment of the present invention and in the conventional switched capacitor circuit in a sampling mode and an integrating mode.
Figure 4B:
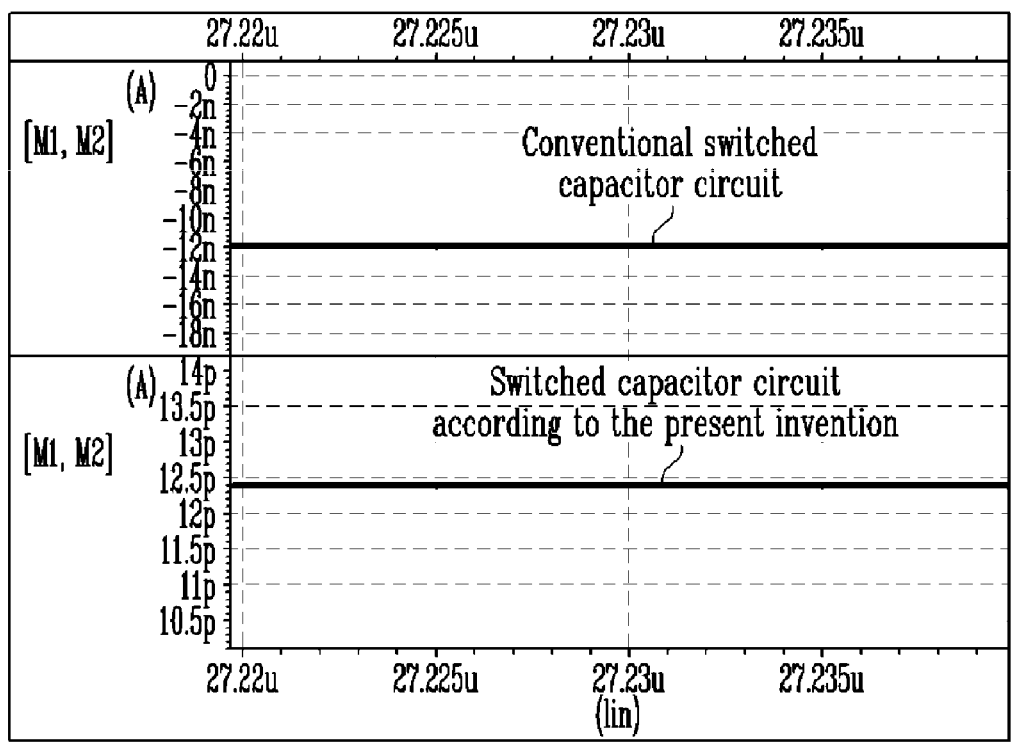

FIGS. 4A and 4B are graphs plotted by computer simulation for comparison of leakage currents in the switched capacitor circuit 200 according to an exemplary embodiment of the present invention and the conventional switched capacitor circuit 100b, in the sampling and integrating modes. For the computer simulation, a CMOS 0.13 um process parameter was used, and an NMOS transistor having a threshold voltage of −150 mV and a PMOS transistor having a threshold voltage of 200 mV were used.

Referring to FIG. 4A, in the sampling mode when the first signal φ1 is 1, the conventional switched capacitor circuit 100b has a leakage current of about 3.7 nA from the fourth MOS transistor M4, but the switched capacitor circuit 200 according to an exemplary embodiment of the present invention has a low leakage current of about 23 pA from the fourth MOS transistor M4.

Referring to FIG. 4B, in the integrating mode when the second signal φ2 is 1, the conventional switched capacitor circuit 100b has a leakage current of about 12 nA from the first and second MOS transistors M1 and M2, but the switched capacitor circuit 200 according to an exemplary embodiment has a low leakage current of about 12 pA from the first and second MOS transistors M1 and M2.

As seen from the simulation results, the switched capacitor circuit 200 according to an exemplary embodiment of the present invention has much less leakage current than the conventional switched capacitor circuit 100b.

Meanwhile, in the present exemplary embodiment, a single-ended switched capacitor circuit is described, but the leakage current reduction circuit 210 according to an exemplary embodiment of the present invention may be applied to a differential switched capacitor circuit.

Figure 5:
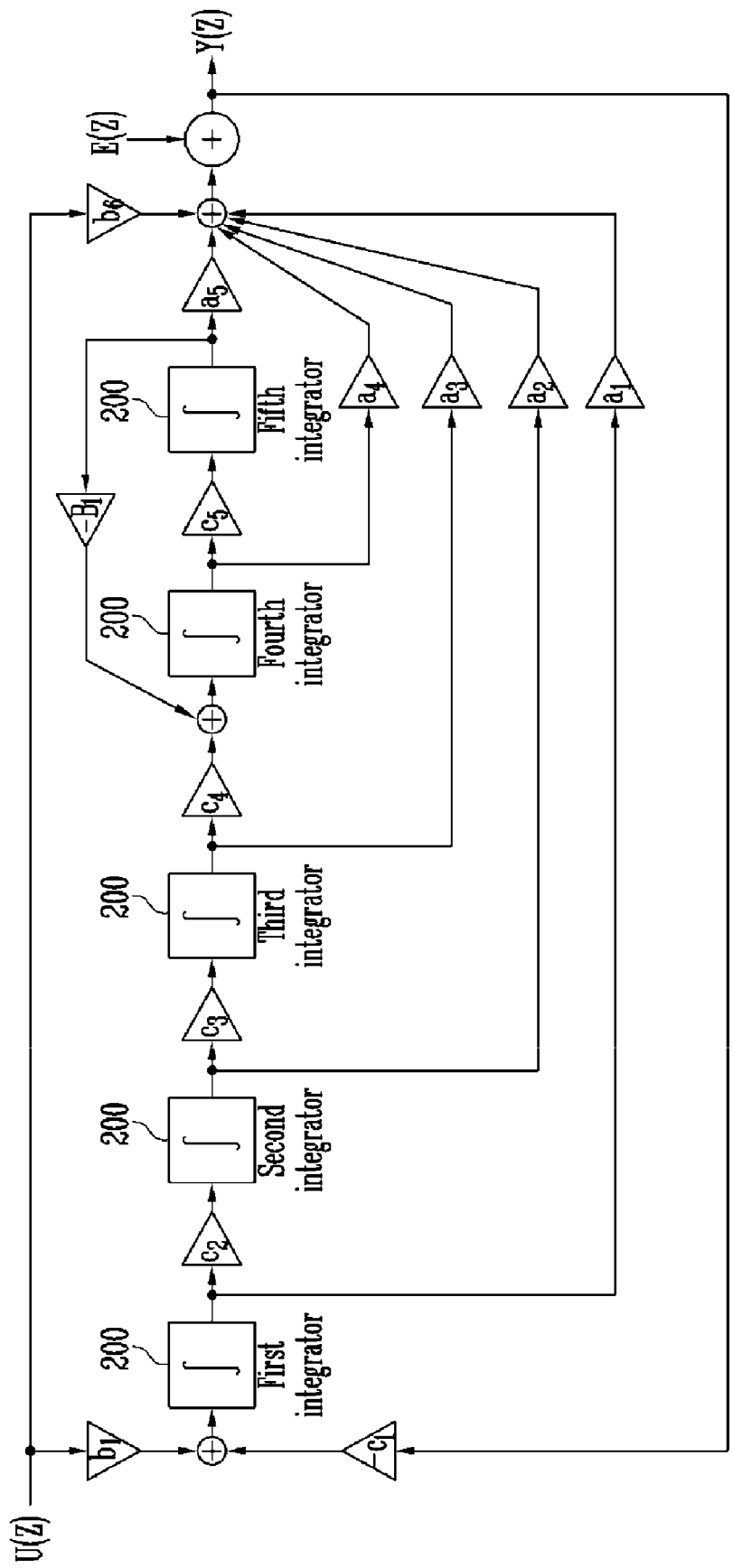
FIG. 5 illustrates an example of a switched capacitor circuit according to an exemplary embodiment of the present invention applied to a 0.6V high-resolution delta-sigma modulator.

FIG. 5 is an example illustrating the switched capacitor circuit 200 according to an exemplary embodiment of the present invention applied to a 0.6V-high-resolution delta-sigma modulator.

Referring to FIG. 5, the switched capacitor circuits 200 according to an exemplary embodiment of the present invention serve as first to fifth integrators, and each switched capacitor circuit 200 has a differential structure.

Figure 6:
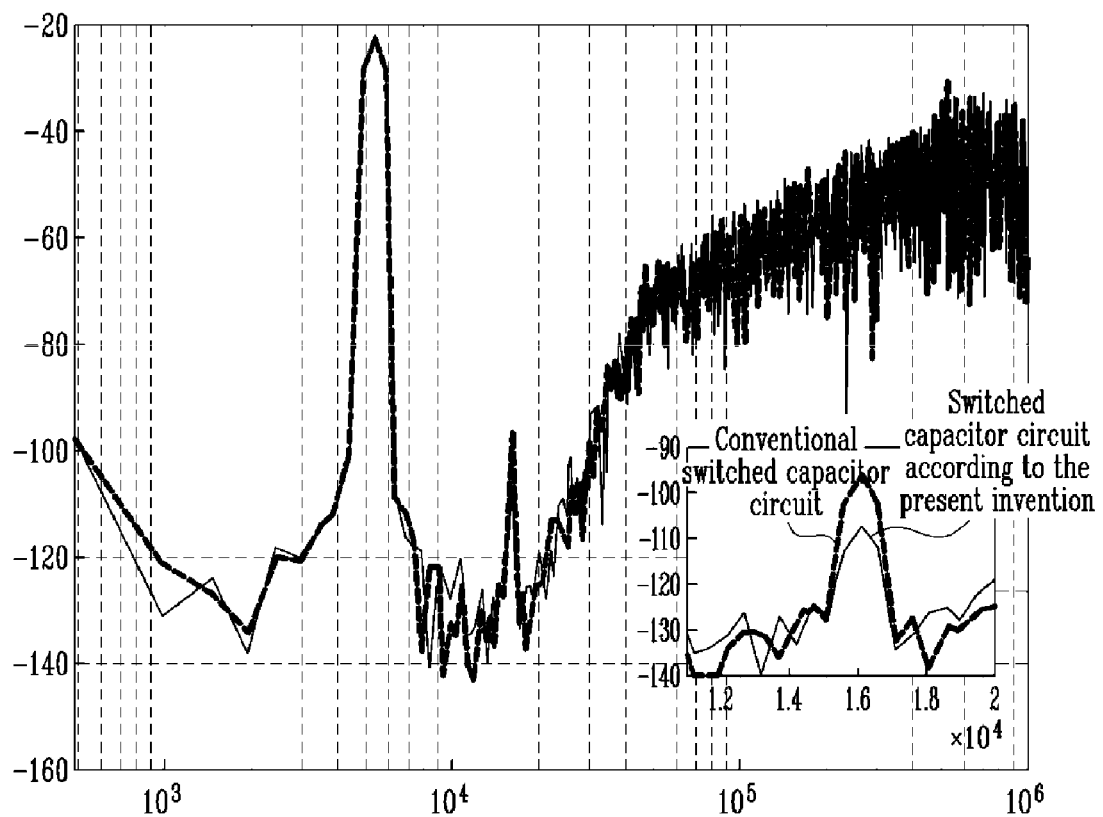
FIG. 6 illustrates a comparison of output fast Fourier transform (FFT) waveforms of delta-sigma modulators which are implemented using the switched capacitor circuit of the present invention and the conventional switched capacitor circuit.

FIG. 6 illustrates output fast Fourier transform (FFT) waveforms of delta-sigma modulators implemented using the switched capacitor circuit 200 according to an exemplary embodiment of the present invention and the conventional switched capacitor circuit 100b. A dotted line indicates the output FFT waveform obtained when the conventional switched capacitor is used as an integrator, and a solid line indicates the output FFT waveform obtained when the switched capacitor circuit 200 according to an exemplary embodiment of the present invention is used as an integrator.

As seen from FIG. 6, the delta-sigma modulator implemented using the switched capacitor circuit 200 according to an exemplary embodiment of the present invention as an integrator has a much smaller harmonic component of an input voltage than the delta-sigma modulator implemented using the conventional switched capacitor circuit 100b as an integrator.

According to the present invention, a switched capacitor circuit prevents leakage current by equalizing voltages at nodes where leakage current tends to flow in a sampling mode, and also prevents an error made in an output signal by minimizing voltage drop caused by leakage current in an integrating mode. Thus, the performance of an ADC, a DAC and an analog filter requiring low voltage and high precision can be improved.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A switched capacitor circuit with reduced leakage current, comprising:
   first and second MOS transistors complementarily connected and configured to output an input voltage received from a first node to a second node in response to a first signal;
   a sampling capacitor a first end of which is connected to the second node;
   a third MOS transistor configured to connect a second end of the sampling capacitor to a first ground terminal in response to the first signal;
   a fourth MOS transistor connected between the second node and a third node and configured to connect the first end of the sampling capacitor to a second ground terminal in response to a second signal;
   an operational amplifier having a feedback capacitor;
   a fifth MOS transistor configured to connect the second end of the sampling capacitor to the operational amplifier in response to the second signal; and
   a leakage current reduction circuit with a first end connected to a voltage input end, a second end connected to the first node, and a third end connected to the third node, the leakage current reduction circuit configured to equalize voltages at two or more nodes among the first node, the second node and the third node, whereby preventing leakage current.

2. The switched capacitor circuit according to claim 1, wherein the leakage current reduction circuit includes
   a sixth and a seventh MOS transistors complementarily connected between the voltage input end and the first node;
   an eighth and a ninth MOS transistors complementarily connected between the voltage input end and the third node;
   a tenth MOS transistor connected between the first and the third nodes and turned on in response to the second signal; and
   an eleventh MOS transistor connected between the third node and the second ground terminal and turned on in response to the second signal.

3. The switched capacitor circuit according to claim 2, wherein a first signal includes a first out-of-phase signal which has an out-of-phase component and a first in-phase signal which has an in-phase component,
   wherein the first out-of-phase signal is input to a gate of the sixth MOS transistor and the first in-phase signal is input to a gate of the seventh MOS transistor, and
   wherein the first out-of-phase signal is input to a gate of the eighth MOS transistor and the first in-phase signal is input to a gate of the ninth MOS transistor.

4. The switched capacitor circuit according to claim 3, wherein drains and sources of the sixth and the seventh MOS transistors are connected in common to the voltage input end and the first node, and drains and sources of the eighth and the ninth MOS transistors are connected in common to the voltage input end and the third node.

5. The switched capacitor circuit according to claim 2, wherein at a sampling mode, the sixth and the seventh MOS transistors and the eighth and the ninth MOS transistors are configured to equalize a voltage at the first node and a voltage at the third node, whereby preventing leakage current flowing in the tenth MOS transistor.

6. The switched capacitor circuit according to claim 5, wherein at a sampling mode, the sixth and the seventh MOS transistors and the eighth and the ninth MOS transistors are further configured to equalize the voltage at the second node and the voltage at the third node, whereby preventing leakage current flowing in the fourth MOS transistor.

7. The switched capacitor circuit according to claim 2, wherein at an integrating mode, the eleventh MOS transistor is configured to equalize a voltage at the first node and a voltage at the second node, whereby reducing voltage drop caused by leakage current flowing in the sixth and the seventh MOS transistors and the eighth and the ninth MOS transistors.

8. The switched capacitor circuit according to claim 7, wherein the eleventh MOS transistor has a lower on-resistance than any of the sixth to the tenth MOS transistors.

9. The switched capacitor circuit according to claim 1, wherein the first out-of-phase signal is input to a gate of the first MOS transistor and the first in-phase signal is input to a gate of the second MOS transistor.

10. The switched capacitor circuit according to claim 2, wherein each pair of the first and the second MOS transistors, the sixth and the seventh MOS transistors and the eighth and the ninth MOS transistors is complementarily connected to constitute one CMOS transistor.

* * * * *